(12) United States Patent
Sherohman et al.

(10) Patent No.: US 6,887,441 B2
(45) Date of Patent: May 3, 2005

(54) HIGH RESISTIVITY ALUMINUM ANTIMONIDE RADIATION DETECTOR

(75) Inventors: John W. Sherohman, Livermore, CA (US); Arthur W. Coombs, III, Patterson, CA (US); Jick H. Yee, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 180 days.

(21) Appl. No.: 10/260,141

(22) Filed: Sep. 30, 2002

(65) Prior Publication Data

US 2004/0061063 A1 Apr. 1, 2004

(51) Int. Cl.$^7$ ............................................... C30B 29/40
(52) U.S. Cl. ........................ 423/87; 423/111; 117/939; 117/950
(58) Field of Search ............................... 117/950, 939; 423/87, 111

(56) References Cited

U.S. PATENT DOCUMENTS

| 3,950,164 | A | * | 4/1976 | Rotenberg et al. ........... 420/538 |
| 4,015,284 | A | * | 3/1977 | Hara et al. .................... 257/10 |
| 5,219,632 | A | | 6/1993 | Shimakura et al. | |
| 5,391,882 | A | | 2/1995 | Rhiger | |
| 6,331,705 | B1 | | 12/2001 | Eisen et al. | |

FOREIGN PATENT DOCUMENTS

| EP | 0939447 | * | 2/1999 |

OTHER PUBLICATIONS

Heinz C., "Reduction of Dislocation Density by Thermal annealing of (100) Gallium Antimonide Substrates" International Journal of Electronics, Taylor and Francis. Lt., London, GB, vol. 75, no. 2, Aug. 1, 1993, pp. 285–287.

Oda O. et al: "Semi–Insulating InP Through Water Annealing". 1997 Int. Conference On Indium Phosphide and Related Materials. Hyannis, Cape Cod, May 11–15, 1997, Indium Phosphide and Related Materials, New York, NY: IEEE US, May 11, 1997, pp. 404–407.

Hirt G. et al: "Annealing and Bulk Crystal Growth of Undoped InP Under Controlled P–pressure: a perspective for the preparation of undoped SI InP?". Indium Phosphide and Related Materials, 1991., Third International Conference. Cardiff, UK Apr. 8–11, 1991, New York, NY, USA, IEEE, US, Apr. 8, 1991 pp. 16–19.

Blamires et al, Free Carrier Lifetime in High Resistivity Aluminium Antimonide. Solid State Communications, vol. 5, pp. 395–397, 1967. Pergamon Press Ltd. Printed in Great Britain.

Shaw et al, Tantalum Doping and High Resistivity In Aluminium Antimonide. Brit. J. Appl. Phys., 1963, vol. 14, pp. 295–300.

Yee, J., et al., "ISb As A High–Energy Photon Detector," IEEE Transactions on Nuclear Sicence, vol. NS–24, No. 4, Aug. 1997, pp. 1962–1967.

Stallinga, P., et al., "Electron Paramagnetic Resonance Study of Se–doped AlSb: Evidence for Negative–U of the DX Center," submitted to Phys. Rev. B, May 15, 1995, pp. 1–14..

(Continued)

*Primary Examiner*—Robert Kunemund
(74) *Attorney, Agent, or Firm*—Michael C. Staggs; Alan H. Thompson

(57) ABSTRACT

Bulk Aluminum Antimonide (AlSb)-based single crystal materials have been prepared for use as ambient (room) temperature X-ray and Gamma-ray radiation detection.

4 Claims, 10 Drawing Sheets

OTHER PUBLICATIONS

Lin, C. T., et al., "Growth and Characterization of Doped and Undopped AlSb Single Crystals," Journal of Crystal Growth 104, (1990), Elsevier Science Publishers B.V., pp. 653–660.

Lin, C. T., et al., "On the Growth of AlSb Single Crystals," Journal of Crystal Growth 94, (1989), Elsevier Science Publishers B.V., pp. 955–958.

Albers, W., "Preparation of Single–Phase Crystals of Compounds with Extremely Small Existence Regions," The Journal of Chemical Physics, vol. 43, No. 12, Dec. 15, 1963, pp. 4401–4402.

Sherohman, J., "Two–Phase Annealing of Single Crystal CdS," UCRL–84859 Preprint, Lawrence Livermore National Laboratory, Jul. 28, 1980, 15 pages.

* cited by examiner

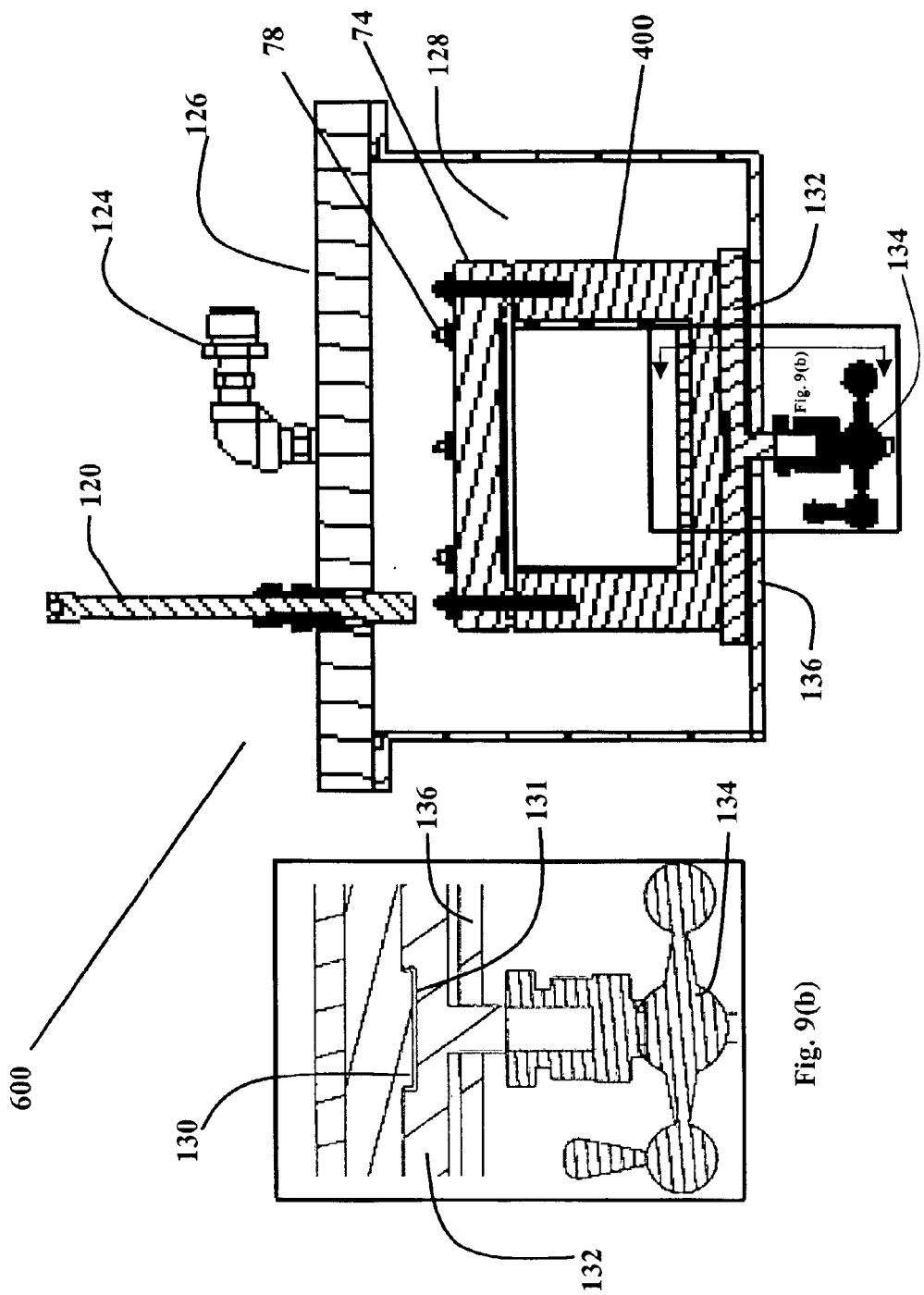

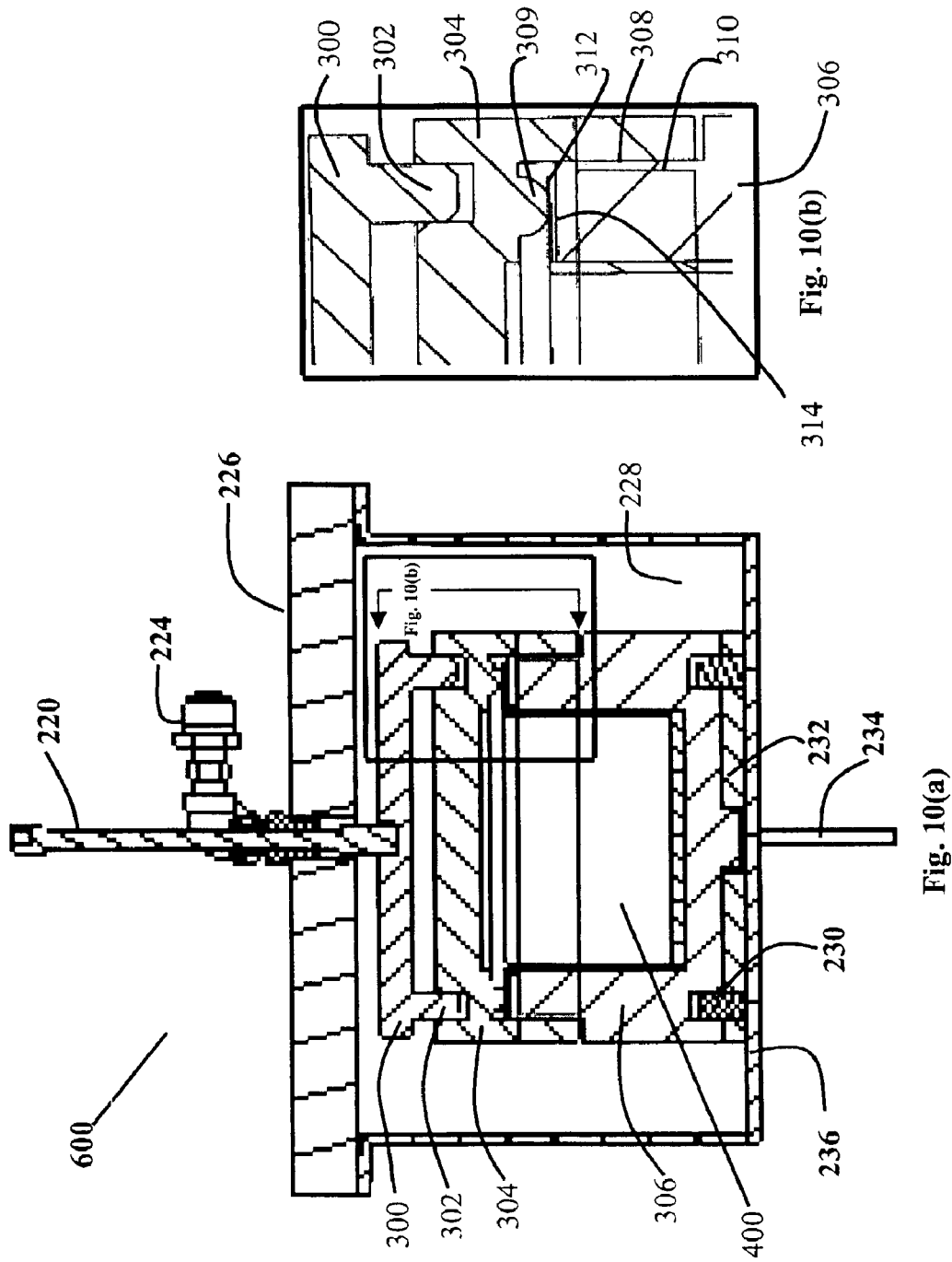

HIGH RESISTIVITY ALUMINUM ANTIMONIDE RADIATION DETECTOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates generally to the tailoring of bulk materials to be suitable for semiconductor applications, and more particularly, to a method of forming a single crystal of AlSb as a material for high-energy radiation detection.

2. State of Technology

Germanium detectors, are unsurpassed for high-resolution gamma-ray spectroscopy and will continue to be the choice for laboratory-based high performance spectrometers. Specifically, Germanium, is a semiconductor that has a relatively low bandgap with a useful property of generating approximately one electron-hole pair for every 2.96 electron Volts (eV) deposited in the bulk of the material. Therefore, for a highly energetic photon of 1 Mev deposited in an exemplary material such as Germanium, the total number of electron hole pairs is approximately 340,000.

However, in order to produce high-resolution detection, Germanium radiation detectors need to operate at liquid-nitrogen temperatures (i.e., −196° C.) to prevent electrons to be thermally excited into the conduction band of the material, (i.e., prevent the generation of noise). Although a number of semiconductor detectors have been developed for ambient temperature operation, e.g., CdTe, CZT, and $HgI_2$, these detectors have been limited by a combination of poor resolution, low efficiency, and degraded performance. There is a strong desire, therefore, to acquire a more suitable material to perform ambient temperature, high-energy x-ray and gamma-ray detection.

SUMMARY OF THE INVENTION

Accordingly, the present invention provides a method that includes preparing a growth melt of a solid crystal to be formed, inserting a seed crystal into a liquid including the growth melt, forming the solid crystal from the liquid; and temperature annealing the solid crystal in a predetermined crucible to produce a high resistivity solid-state radiation detector.

Another aspect of the present invention is to provide a method of producing an ambient solid state gamma ray or X-ray detector that includes first preparing a predetermined set of materials. This step further includes weighing out a substantially pure Al material and a substantially pure Sb material in a predetermined proportion to form an AlSb compound. Next, the Al material and an Sb ingot formed from the Sb material are acid etched to substantially remove an oxide slag and a high temperature crucible such as an alumina ($Al_2O_3$) or zirconia ($ZrO_2$) crucible is pre-heated at about 1200° C. to remove a moisture content and ensure a complete outgassing of the crucible. The Al material is placed in the crucible, and a Tantalum (Ta) cage having one or more wires is adapted to hold the Sb ingot prior to being added to a melt. The cage is removably attached to a stainless steel rod that is mounted through a port on a chamber lid, a vacuum is generated inside a crystal grower, the crucible is heated to about 1000° C. for several hours to remove slag from the Al melt. While at temperature Argon gas is injected into the grower to a pressure of about one atmosphere within the chamber. The temperature of the crucible is next raised above a melting temperature of AlSb, and the rod with the removably attached Sb material is lowered into the crucible until it melts so that the resultant melt surface is substantially slag free. The crucible is then rotated. The next step includes inserting a seed crystal into a liquid containing the growth melt. A further step includes forming the solid crystal from the liquid. A final step includes temperature annealing the solid crystal in a predetermined crucible, in which the temperature annealing step further includes combining a heated first mixture of a two-phase material that has a solid AlSb and a liquid Al—Sb, the first mixture having a majority of Sb atoms, and a heated second mixture of a two phase material that has a solid AlSb and a liquid Al—Sb, the second mixture having a majority of Al atoms. The solid crystal is then placed in the presence of the first and the second two phase mixtures; and annealed under a constant temperature and a constant volume within the predetermined crucible to produce a stoichiometric AlSb crystal material that is capable of detecting gamma radiation, the AlSb crystal having an energy bandgap greater than about 1.62 eV, an electron and a hole mobility greater than or equal to about 100 $cm^2$/Vs, a free carrier recombination time ($\tau$) greater than about $10^{-6}$ s, and a resistivity greater than about $10^7$ Ω-cm.

Another aspect of the present invention is to provide a method of producing an ambient solid-state gamma ray or X-ray detector that includes first preparing a predetermined set of materials without an acid etching step. This includes creating a vacuum within the crucible, introducing an Argon gas at a pressure of about one atmosphere, heating the Al and the Sb material to a liquid state, inserting an alumina-mixing rod removably attached to a stainless steel rod that is mounted through a port on a chamber lid while the crucible is rotating, mixing with the alumina-mixing rod for about 60 minutes, lowering the temperature to just above the melting temperature of a solid AlSb for a predetermined time period to stabilize the liquid Al—Sb, further lowering the temperature such that a dendritic crystal growth occurs from the alumina rod, allowing the dendritic growth to continue until the growth substantially approaches a wall of the crucible; and removing the alumina rod from a melt, the alumina rod having a solid lid of dendritic AlSb, in which the rod is placed along a cooled inside wall of a grower to produce the melt substantially free of a slag. A second step includes inserting a seed AlSb crystal into a liquid that has the growth melt. A third step includes forming the solid AlSb ingot from the liquid. A final step includes temperature annealing the as-grown solid crystal(s) in a predetermined crucible, in which the temperature annealing step further includes combining a heated first mixture of a two-phase material that has a solid AlSb and a liquid Al—Sb, the first mixture having a majority of Sb atoms, and a heated second mixture of a two phase material that has a solid AlSb and a liquid Al—Sb, the second mixture having a majority of Al atoms. The solid crystal(s) is then placed in the presence of the first and the second two phase mixtures; and annealed under a constant temperature and a constant volume within the predetermined crucible to produce a stoichiometric AlSb crystal(s) that is capable of detecting gamma radiation, the AlSb crystal having an energy bandgap greater than about 1.62 eV, an electron and a hole mobility greater than or equal to about 100 $cm^2$/Vs, a free carrier recombination time ($\tau$) greater than about $10^{-6}$ s, and a resistivity greater than about $10^7$ Ω-cm.

Another aspect of the present invention is to provide a material for detecting gamma rays or x-rays having an energy bandgap greater than about 1.40 eV, an electron and a hole mobility greater than about 100 cm²/Vs, a free carrier recombination time ($\tau$) greater than about $10^{-6}$ s, a resistivity greater than about $10^7$ $\Omega$-cm; and at least one of the elements has an atomic number (Z) greater than about 40.

Another aspect of the present invention is to provide a temperature annealing crucible to control solid state crystal stoichiometry that includes an outer crucible having a first lid and a bottom with an open end, the bottom adapted to receive an inner crucible, the inner crucible adapted to receive a solid crystal and a first and second two-phase mixture, the inner crucible having a second lid to enclose the inner crucible, such that the inner crucible is removably inserted into the bottom of the outer crucible, a sealing means positioned therebetween the first open end and the first lid of the outer crucible; and a means of pressure sealing the first lid and the sealing means to the bottom portion of the outer crucible.

A further aspect of the present invention is to provide a detector that is integrated with operationally connected electrical circuitry such that the high resistivity AlSb crystal generates a representative signal as a result of interacting electromagnetic radiation.

Accordingly, the invention provides a method of producing a III-V semiconductor material having desired properties of an energy band-gap greater than about 1.40 eV, an electron and a hole mobility greater than about 100 cm²/Vs, a free carrier recombination time ($\tau$) greater than about $10^{-6}$ s, at least one element having an atomic number (Z) greater than about 40, and a resistivity greater than about $10^7$ $\Omega$-cm. Such a material is capable of semi-conductor device applications such as but not limited to X-ray and Gamma-ray detection at ambient (i.e., room) temperatures, optical memory storage devices, photovoltaic/solar cell applications, integrated substrate material, and bulk single crystal material for heterostructure semiconductor mid-IR laser applications.

BRIEF DESCRIPTION OF THE DRAWINGS

The accompanying drawings, which are incorporated into and form a part of the disclosure, illustrate an embodiment of the invention and, together with the description, serve to explain the principles of the invention.

FIG. 9(a) shows a cross-section of a steel chamber used for assembling crucibles of the present invention under vacuum, prior to an annealing step.

FIG. 9(b) shows an enlarged section of the rotation means used in the present invention for accessing crucible nuts.

FIG. 10(a) shows a preferred embodiment of a steel evacuated chamber used for assembling a preferred embodiment of a crucible of the present invention.

FIG. 10(b) shows an enlarged section of the threading means and an annular protrusion used for pressure sealing a preferred crucible embodiment.

DETAILED DESCRIPTION OF THE INVENTION

Figure 1:
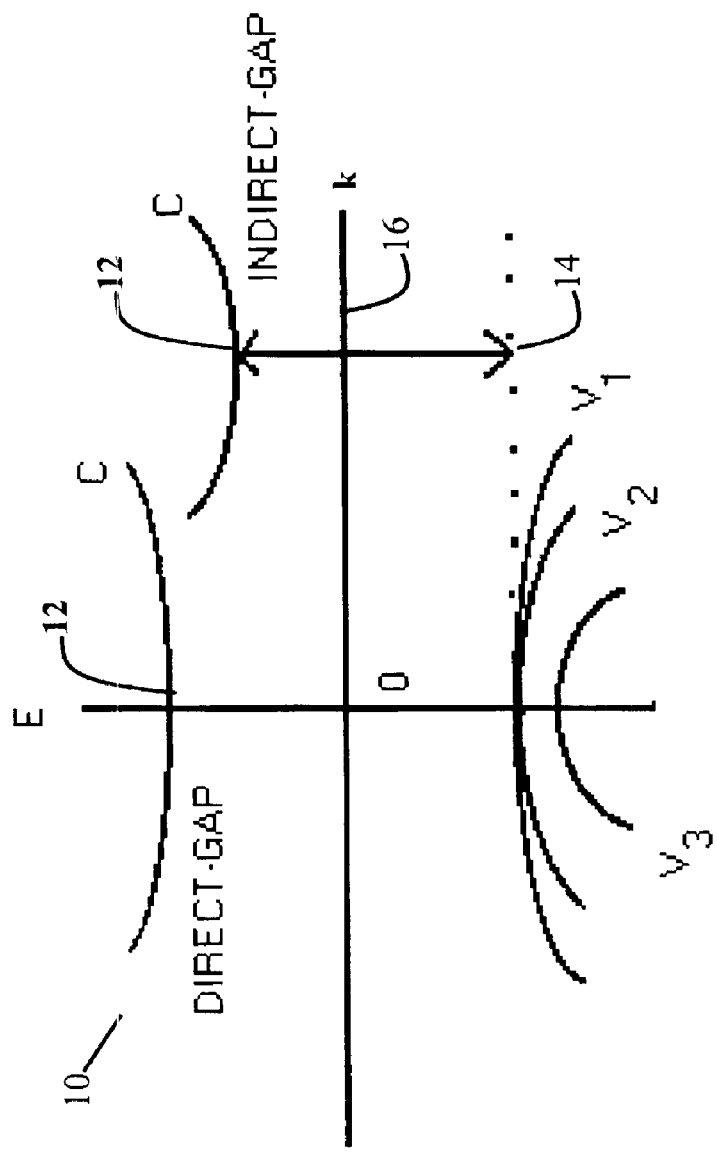
FIG. 1 illustrates an indirect energy band-gap diagram of a semiconductor material.

Referring now to the following detailed information, and to incorporated materials; a detailed description of the invention, including specific embodiments, is presented. The detailed description serves to explain the principles of the invention.

Unless otherwise indicated, all numbers expressing quantities of ingredients, constituents, reaction conditions and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical value, however, inherently contain certain errors necessarily resulting from the standard deviation found in their respective testing measurements.

General Description

In theory, semiconductor crystals can detect radiation as long as the energy of the radiation is greater than the energy band gap of the crystal. From a practical point of view, however, only certain semiconductors can be used to detect very low-intensity, high-energy radiation. A semiconductor crystal suitable for detecting low-level, high-energy radiation at room temperature is designed to satisfy certain basic criteria:

The energy band gap is required to be substantially large ($E_g$>1.4 eV)

The electron and hole mobilities is required to be substantially high ($\geq$100 cm²/Vs)

At least one of the elements is required to be of a high atomic number (Z>40)

The free carrier recombination time is required to be substantially long ($\tau$>$10^{-6}$ s)

At room temperature, reduction of the noise-to-signal ratio requires materials of relatively wide energy band gap. Materials of interest, therefore, intrinsically have high resistivity. Because high-energy radiation is very penetrating, the detector is required to have a thick sensitive region that is comparable to the absorption length of the radiation. The detector material must also be of high Z (i.e., atomic number), since the absorption coefficients for photoelectric generation, Compton scattering, and pair productions are proportional to $Z^n$, $Z$, and $Z^2$, (where n is variable, e.g., n is varied from about 4 to 4.6 for about 0.1 Mev to about 3 Mev), respectively. For high-resolution spectroscopy, charge collection within the sensitive region must be very efficient over long distances (e.g., greater than 1 cm), which implies the use of very pure materials with small trapping densities. A radiation detector material thus requires a carrier mean free length $\lambda_c$ (also referred to as the mean drift length or the mean trapping length) that is comparable to the detector length D (i.e. $\lambda_c=D$), where $\lambda_c$ is given as:

$$\lambda_c = \mu_c E \tau_c,$$

and E is the electric field applied to the detector. The subscript c refers to either the electrons or the holes.

The aluminum antimonide (AlSb) semiconductor material is a member of the III–V family of semiconductors including GaAs, InSb, GaP, etc. Of particular interest are the characteristic features of AlSb that are similar to the group IV semiconductors Ge and Si, and the III-V semiconductor GaAs: similar to Ge, Si and GaAs, AlSb has a zinc-blend cubic crystal structure, similar to Ge and Si, but unlike GaAs, AlSb has an indirect energy band gap, and similar to GaAs, but unlike Ge and Si, the energy band gap ($E_g$) is relatively high, i.e., an $E_g$ of about 1.62 eV.

Such structure and band-gap features of AlSb provides a material that is useful as an electronic device quality semiconductor detector. For example, the substantially large band-gap of AlSb results in a reduced signal-to-noise ratio that allows the material to operate as a room (ambient) temperature (i.e., between about 20° C. and about 25° C.) gamma ray detector. However, the detector of the present invention is additionally capable of operating at greater than –196° C. to about 45° C. if desired. By contrast, Germanium gamma-ray detectors typically needs to operate at –196° C. to reduce noise levels (i.e., cooling by liquid Nitrogen that can add bulk and other system requirements).

However, attempts by others to produce quality AlSb crystals have been unsuccessful. The Al—Sb system is difficult to process, and the growth of undoped AlSb single crystals have resulted in very low resistivities from a range of 0.1 to 10 Ω-cm that consistently have an unstable composition when exposed to the atmosphere. The combination of very low resistance and an unstable composition are indicative of the lack of crystal purity and stoichiometry.

Accordingly, the present invention provides a quality high-resistivity (i.e., greater than about $10^7$ Ω-cm), high resolution, high-energy radiation room temperature AlSb detector.

Specific Description
Indirect and Direct Energy Band Structure

Turning now to the drawings, FIG. 1 shows an energy band diagram 10 of an indirect band-gap material such as Silicon, Germanium or AlSb. A bottom of a conduction band 12 and a top of a valence band 14 do not occur at the same value of k 16 in energy band diagram 10. Electrons (not shown) at the bottom of conduction band 12 cannot combine with holes (not shown) at the top of valence band 14 unless the law of conservation of the momentum is upheld. Thus, an electron in an indirect band-gap material must either emit or absorb a phonon (i.e., a quantum particle associated with the vibration of a crystal lattice) to conserve momentum between the initial and final states.

Figure 2B:
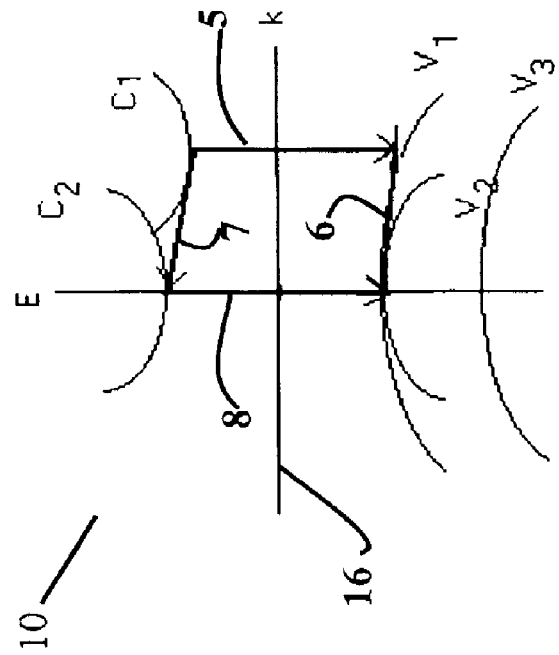
FIG. 2(b) illustrates further indirect energy band recombination processes of a semiconductor material.
Figure 2A:
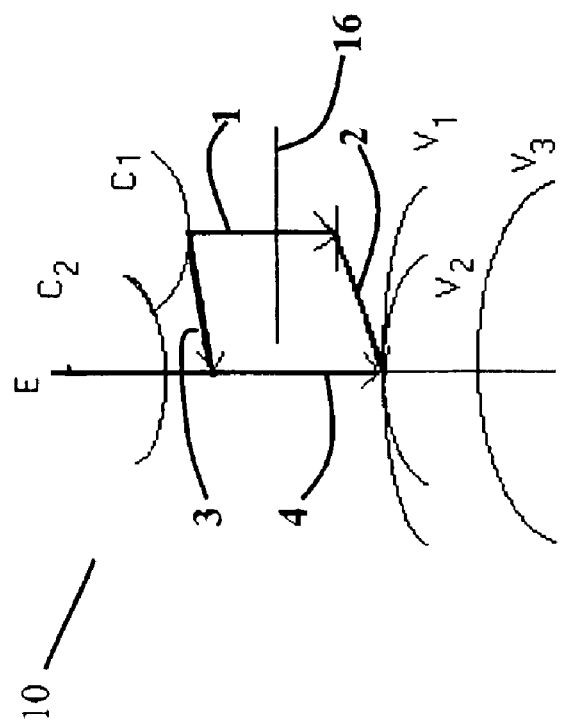
FIG. 2(a) illustrates indirect energy band recombination processes of a semiconductor material.

FIG. 2(a) and FIG. 2(b) illustrate energy band 10 recombination processes to clarify the various transitions. As shown in FIG. 2(a), an electron can recombine with a hole in the valence band by following path 1 to path 2 or by completing a transition by path 3 to path 4. For path 1 to path 2, electrons emit a photon and then emit a phonon, while for path 3 to path 4, electrons emit a phonon then emit a photon. FIG. 2(b) shows a recombination process whereby an electron follows path 5 to path 6. In this case, an electron emits a photon and then absorbs a phonon. The opposite occurs for path 7 to path 8, e.g., an electron absorbs a phonon and then emits a photon. The lifetime of an electron or a hole in indirect-gap materials that contains impurities also result in much longer lifetimes than in a direct-gap material with equivalent impurities because substantially all recombination processes in an indirect-gap material are accomplished with the emission or absorption of a phonon. In all cases the indirect band-gap requires a second order process involving a phonon for the conduction electron to recombine with the hole in the valence band.

Figure 3:
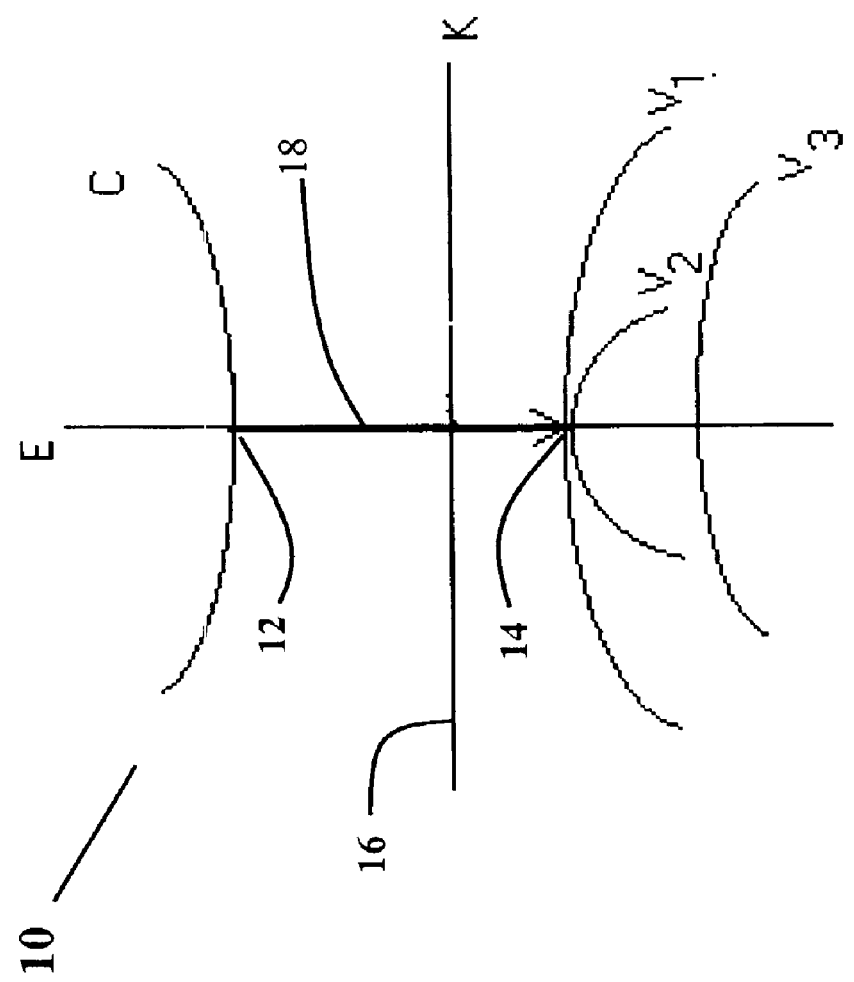
FIG. 3 illustrates a direct energy band-gap diagram of a semiconductor material.

In a direct band gap material, however, the recombination process is straightforward. FIG. 3 illustrates an energy band diagram 10 for a direct-gap material. The bottom of the conduction band and the top of the valence band occur at the same k 16 value in energy band diagram 10. Thus, a conduction electron (not shown) in conduction band 12 can directly combine with a hole (not shown) by path 18 in valence band 14 without the absorption or emission of a phonon. This occurs because the momentum of both carriers is the same and the law of conservation of momentum is not violated during the transition.

AlSb is an ideal candidate for room temperature gamma-ray radiation detection because of its electronic band structure. The band structure of AlSb shows an indirect energy band gap of 1.62 eV and a direct band gap of 2.32 eV. Because of the indirect-gap, the electron-hole recombination time is substantially long when compared to direct-gap semiconductors for similar trapping concentration and is calculated to be greater than 10 microseconds. At 300° K, a theoretical electron mobility $\mu_e$ and a hole mobility $\mu_h$ for AlSb is computed to be approximately 480 $cm^2$/V-s and 400 $cm^2$/V-s, respectively. These theoretical values illustrate that a hole mobility for AlSb is found to be comparable to Si. The highest reported electron mobility has been about 350 $cm^2$/V-s. For holes, the highest value has been about 400 $cm^2$/V-s. In comparison with other known ambient temperature detector materials, because of the long carrier lifetime associated with the indirect band-gap of AlSb, the intrinsic properties of AlSb indicate a better charge collection efficiency than CdTe, CZT, or $HgI_2$, especially for large detector volumes. The crystals of the present invention are as one embodiment, produced by a Czochralski (CZ) growth technique. However, other growth methods such as a Traveling Heating Method (THM) capable of producing quality crystals may also be employed. For example, growth of AlSb by THM produces quality crystals because it is a lower temperature process but the technique requires a slow growth rate (i.e., between about 1 and about 5 mm/day) and the ingot is often polycystalline with limited crystal size. A beneficial feature of the Czochralski technique is that a large AlSb ingot is not confined by the walls of the crucible. This aspect is a beneficial factor due to the large volume expansion of the growth material and because a larger crystal volume offers a greater interaction potential for gamma rays and for better resolution. In addition, this method of crystal growth is used in the semiconductor industry in growing large ingots of Si and Ge, which enables the industry to transition into growing this material if necessary.

Growth Apparatus

Figure 4:
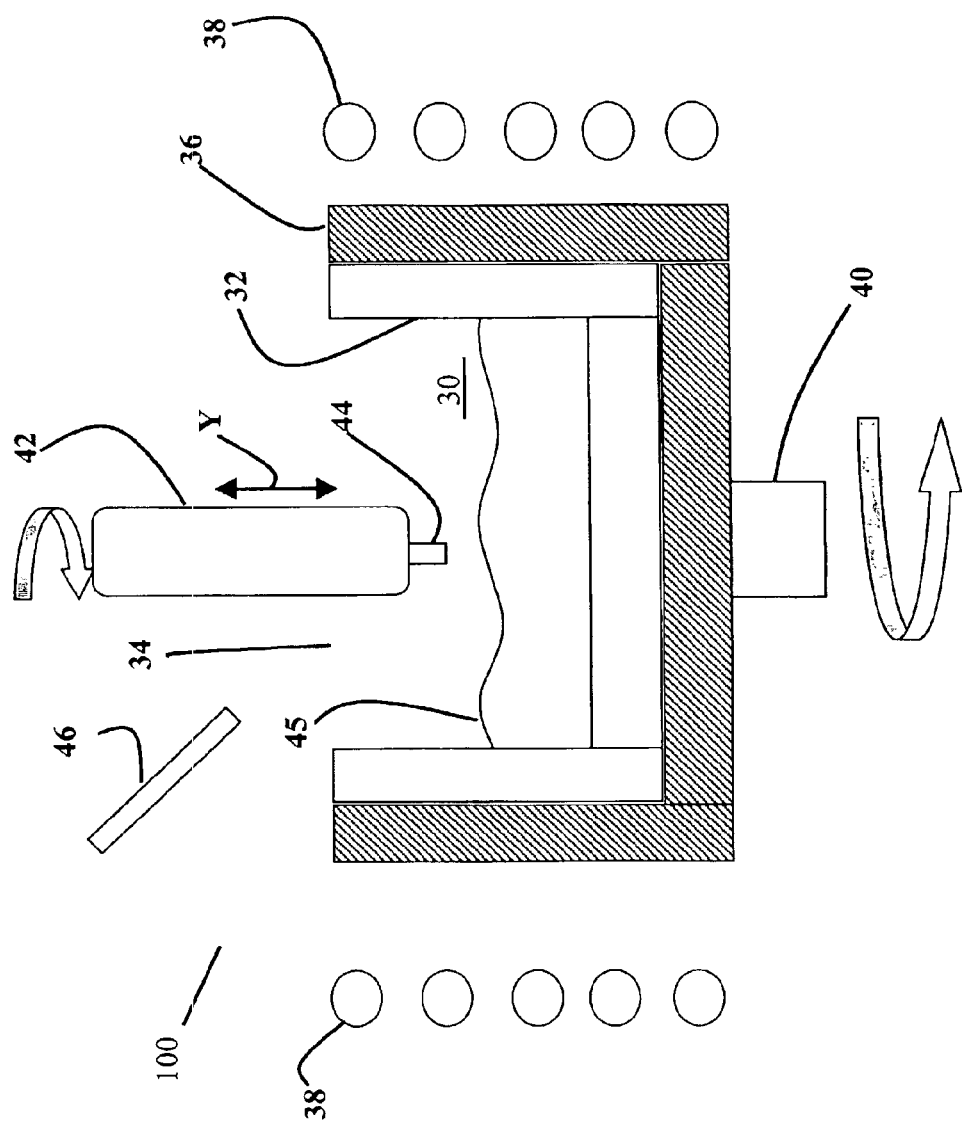
FIG. 4 illustrates a cross-section view of a modified Czochralski (CZ) crystal growth apparatus used in the present invention.

FIG. 4 shows an exemplary Czochralski (CZ) crystal growth apparatus that may be employed to form a solid crystal in accordance with methods of the present invention. CZ apparatus generally designated as reference numeral 100, is a modified conventional apparatus that includes a crucible 30 disposed in a chamber (not shown), having an elongated cylindrical body 32 and an opening 34 at an upper end. Crucible 30 may be formed from alumina or other suitable material capable of meeting the requirements of the present invention. Substantially all graphite elements were removed to reduce carbon contamination. A susceptor 36, composed of graphite or other suitable material is configured inside the chamber around the crucible 30. An RF heating coil 38 designed to match an impedance of an RF generator (not shown) is positioned around susceptor 36. Susceptor 36 is heated by coil 38, which in turn supplies heat to the interior of crucible 30. However, any heating means such as an electrical resistance heater may be employed in conformance with the heating requirements for apparatus 100.

CZ apparatus 100 also includes a rotating support member 40. Rotating member 40 engages a lower portion of susceptor 36 to rotate susceptor 36 in a clockwise or counter clockwise direction during a crystal growth process. Suitable speeds for rotating member 40 is between a preferred range of 1 to 30 rpm. CZ apparatus 100 also includes a pull shaft 42 capable of translation in the vertical direction as shown by the double sided arrow denoted Y, and is disposed above crucible 30 for a holding a seed 44, such as but not limited to AlSb on its lower end. Shaft 42 may concurrently rotate and vertically move seed 44 during the process of growing an exemplary crystal. A liquid melt 45 of crystal growth material is formed inside crucible 30 as coil 38 supplies power to susceptor 36, which heats susceptor 36 that supplies heat to melt a disposed metal growth material such as Al and Sb inside crucible 30 to form AlSb. One or more gas lines 46 may be positioned above opening 34 to remove reactant products or to maintain a suitable atmosphere within the chamber.

Slag Removal

Although the Czochralski method is more suited to AlSb, growing an ingot is made difficult by the fact that oxide layers (i.e., a slag) are formed on a liquid surface upon melting the aluminum and antimony constituents or the compound itself. Removal of an oxide or slag layer is very important since contact of the floating slag with the ingot during growth will introduce defects and develop polycrystalline material.

A preliminary method of removing a slag and conditioning crucible 30, as shown in FIG. 4, includes purchasing Al and Sb metals of predetermined lengths and widths having a purity greater than about 90% as one embodiment, or greater than about 95% as another embodiment, or as a final embodiment, having a purity greater than about 99.9999%. The Al and Sb metal are then weighed out appropriately, depending on the size of the predetermined final ingot, for the AlSb compound. Etching these metals in an acid mixture of, for example, $HF:H_2O_2$ (1:2), then etching in $HNO_3:HCL$ (1:1), helps reduce the layer of slag that has formed on their surfaces. Pre-firing an alumina crucible at about 1200° C. removes moisture from the surface and substantially ensures complete outgassing. Next, further removal of a slag can proceed.

Figure 5:
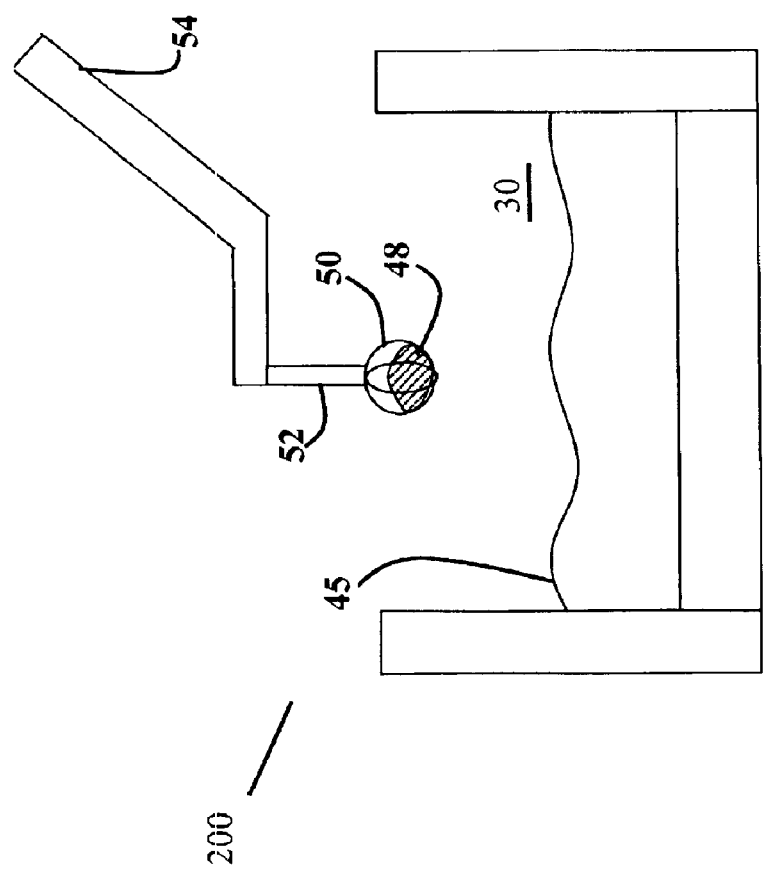
FIG. 5 illustrates a first method embodiment of removing oxide layers (i.e., a slag) prior to crystal growth.

FIG. 5 shows only those components of FIG. 4 to illustrate a first method embodiment of further removing a slag and is generally designated by reference numeral 200. Al metal (not shown) by itself is placed inside crucible 30 while an etched Sb metal ingot 48 is placed in a Tantalum (Ta) one or more wire cage 50 that is suspended by a Ta wire 52. However, any method of holding ingot 48 that is capable of meeting the specifications of the present invention may be employed. Ta wire 52 is connected to a stainless steel rod 54, mounted through a constructed port (not shown) on a chamber lid (not shown). Using this port, stainless steel rod 54 can be moved around inside the crystal grower from outside so that ingot 48 can be lowered into the heat zone, i.e., towards melt 45. In this way, Sb ingot 48 inside Ta wire cage 50 can be placed along a water-cooled inner wall (not shown) of the grower away from the heat zone until needed. With the Al and Sb metals and a polished AlSb seed attached to pull shaft 42, as shown in FIG. 4 in place, a vacuum is generated inside the crystal grower of FIG. 4. Crucible 30 containing Al metal is then heated to about 1000° C. This operation of heating the Al metal to about 1000° C. in vacuum produces within hours (actually the time required is surface oxide dependent) a mirror look to a resultant Al melt. This occurs because the slag under these conditions produces an AlO gas that is then pumped away, eventually eliminating the slag altogether. When the slag layer from the Al melt is removed, Argon (Ar) gas is introduced through gas line(s) 46, as shown in FIG. 4, into the grower at up to one atmosphere. The temperature of the crucible is then raised above the melting temperature $T_m$ of AlSb ($T_m$ of about 1080° C.). At this time, Sb ingot 48 is introduced by moving stainless steel rod 50 over the heat zone and then lowering it, letting the Sb melt into crucible 30 and the little amount of slag from the etched Sb ingot 48 that gets into the melt is captured along the wall of crucible 30 by rotation. Such a method has produced an exemplary 7-cm diameter ingot weighing about 609 grams grown in an 8-cm crucible.

Figure 6:
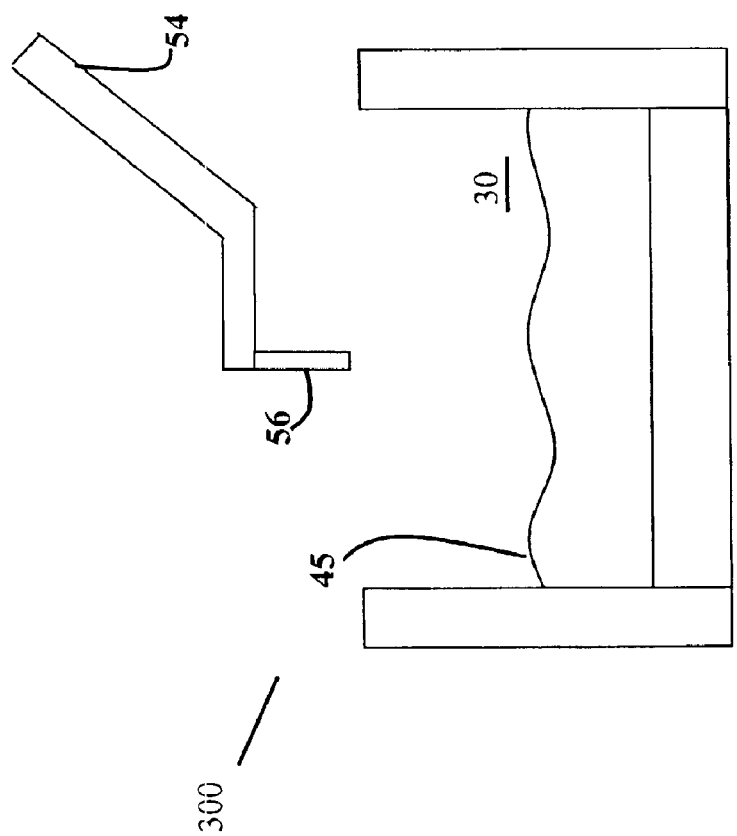
FIG. 6 illustrates a second and preferred method embodiment of removing oxide layers (i.e., a slag) prior to crystal growth.

FIG. 6 shows those components of FIG. 4 to illustrate a second but preferred embodiment of further removing a slag that is more applicable and scalable to production and is generally referenced as numeral 300. Al (not shown) and Sb (not shown) metals are both placed in alumina crucible 30 without acid etching. A vacuum is generated and Ar gas is introduced at up to one atmosphere through gas line(s) 46, as shown in FIG. 4. The Al and Sb metals are heated to the liquid state, and because of the large amount of slag over the entire surface of melt 45, which greatly reduces Sb vaporization, the mixture is allowed to react to form AlSb at a very high temperature of about 1250° C. Attached to stainless steel rod 54 this time is one or more alumina-mixing rods 56 that is inserted into melt 45. Alumina-mixing rod(s) 56 ensures good mixing as crucible 30 is rotating, but it also has another purpose. After an hour of mixing, a predetermined temperature of crucible 30 is lowered to just above the melting temperature of AlSb. After stabilizing at this temperature, the temperature is further lowered such that a dendritic (i.e., a patterned) crystal growth occurs from alumina-mixing rod(s) 56. Under these conditions, alumina-mixing rod(s) 56 has become a large heat sink. The dendritic growth from alumina-mixing rod(s) 56 is allowed to proceed until it reaches to almost the wall of crucible 30. At this time, alumina-mixing rod(s) 56 is removed from melt 45, lifting a solid lid of dendritic AlSb (not shown), which has captured a great deal of the slag. Alumina-mixing rod(s) 56 is then placed along a cooled inside wall (not shown) of the grower of FIG. 4, resulting in melt 45 that is basically free from slag. This preferred approach is suitable for even larger crucible diameters greater than 10 cm. This direct approach eliminates etching, pre-firing of Al, and the subsequent separate melting of Sb; hence, offering a more economic and efficient production capability to produce AlSb single crystal ingots by the Chzochralski method.

In both embodiments of removing a slag, as shown in FIG. 5 and FIG. 6, melt 45 is left with a large proportion of the melt surface being slag free. AlSb seed 44, as shown in FIG. 4, can now be lowered to begin the growth process. During growth, both crucible and seed are rotated. Upon seed equilibration with melt 45, seed 44 is pulled from liquid melt 45 within a preferred range of 0.5 to 1 cm per hour. Crystals pulled by this method are usually very low resistivity material. Other researchers have shown that doping melt 45 with other elements can increase the resistivity. However, the highest single crystal resistivity produced has been with a Selenium dopant to produce resistivity on the order of $10^4$ Ω·cm. This is still much too low for room temperature radiation detection, which requires resistivities on the order of greater than about $10^8$ Ω-cm. Having a large energy band gap, AlSb is expected to have a resistivity on the order of at least $10^{10}$ Ω-cm. Thus, the process of the present invention takes as-grown crystals of AlSb and converts them to high resistivity material using an annealing heat treatment that will be discussed herein. Such a high resistivity, along with the other properties discussed herein before and herein after, allows the material to be integrated into electronic circuitry for use as a room temperature detector in which a high-resolution signal can be achieved that is at least that of a Ge radiation detector having a range of Full Width Half Maximum (FWHM) from about 2 to about 2.5 KeV for gamma-ray energies of about 0.8 to about 1.6 MeV. Moreover, room temperature operation eliminates accompanying cryo-cooling equipment, such as that used in Germanium gamma-ray detection systems, thereby eliminating excess bulk and weight and which allows simple and fast on-off switch operation (i.e., no waiting period to, for example, cool down the detector to operating conditions).

Material Phase Diagram Analysis

To produce a high resistivity AlSb single crystal, it is important to gain control of the stoichiometry as well as compensating for unwanted impurities or charged native defects. Control of the stoichiometry is conducted by a controlled atmosphere annealing on as-grown AlSb single crystals, which may be intrinsic (undoped) or doped with a compensating element.

Figure 7:
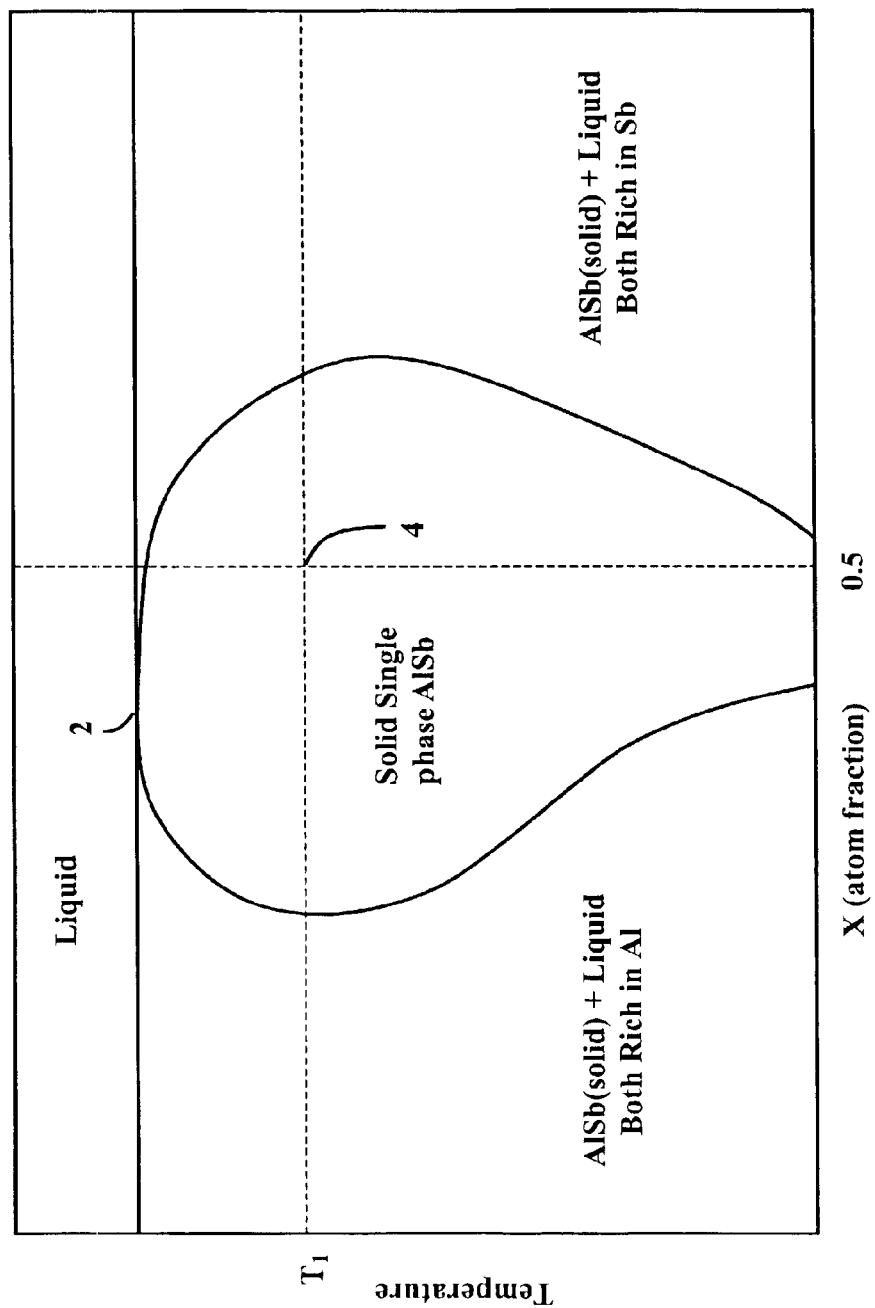
FIG. 7 shows an example AlSb phase diagram of Temperature versus Sb atomic fraction ratios used in determining crystal stoichiometry.

FIG. 7 shows an example AlSb phase diagram of Temperature versus Sb atomic fraction ratios. Such a diagram, capable of being constructed for other crystal compositions, allows determination of the single-phase width for solid AlSb so that an annealing process of the present invention can correct the degree of non-stoichiometry as a result of the growth of the material that produces low resistivity. An estimated single-phase region 2 shown in FIG. 7 indicates that growth of solid AlSb from the melt produces a solid composition having a majority of Al atoms with an Al vacancy concentration of about $2.5 \times 10^{18}$ cm$^{-3}$ and an Sb vacancy concentration of about $5.6 \times 10^{18}$ cm$^{-3}$. Thus, the vacancies of Al and Sb contribute to the known hydrolytic nature of AlSb, i.e., unpaired bonds result in atmospheric deterioration that continues through the bulk AlSb material. Over time, the material will eventually disintegrate to a powder. By making use of the AlSb phase diagram FIG. 7, and the fact that two phases in equilibrium produce a constant vapor pressure made up of partial pressures of the constituents, the Sb vacancies can be reduced by the annealing process to adjust the crystal composition to a stoichiometric state, as indicated at a 0.5 atomic fraction 4 for Sb.

Accordingly, a heated mixture of AlSb and Sb produces a two-phase material composed of solid AlSb and liquid, both of which have a majority of Sb atoms. Likewise, a heated mixture of AlSb and Al produces a two-phase material composed of solid AlSb and liquid, both of which have a majority of Al atoms. As-grown single crystals are annealed in the presence of an appropriate mixture of these two-phase materials to generate stoichiometric material, i.e. the composition having a majority of Al atoms of the crystal changes by taking on Sb from the vapor phase until the crystal is in equilibrium with both of the two-phase materials. By controlling the stoichiometry of as-grown AlSb by a proper temperature anneal, the intrinsic vacancy concentration can be lowered, which reduces the charged native defect concentration. In the case of further compensating the charged native defects, a dopant concentration can be added to the melt. Lowering the charged native defect concentration implies that a lower dopant concentration is required for compensation. Likewise, lowering the dopant concentration will minimize its effect on the mobility of the free carriers. In this way, high resistivity crystals are produced without significantly affecting the intrinsic free carrier mobilities.

Annealing/Crucible

It is important in this step to ensure that an annealing crucible of the present invention is of constant volume and temperature. A reusable high-temperature graphite crucible of the present invention permits annealing of as-grown crystals in a controlled atmosphere of partial pressures of Sb and Al. Such a disclosed crucible provides constant temperature and volume and can be used at a high temperature for extended periods of time. Because the crucible is reusable, it allows a cost-effective approach over the use of quartz ampoules preferably used by those skilled in the art.

Figure 8:
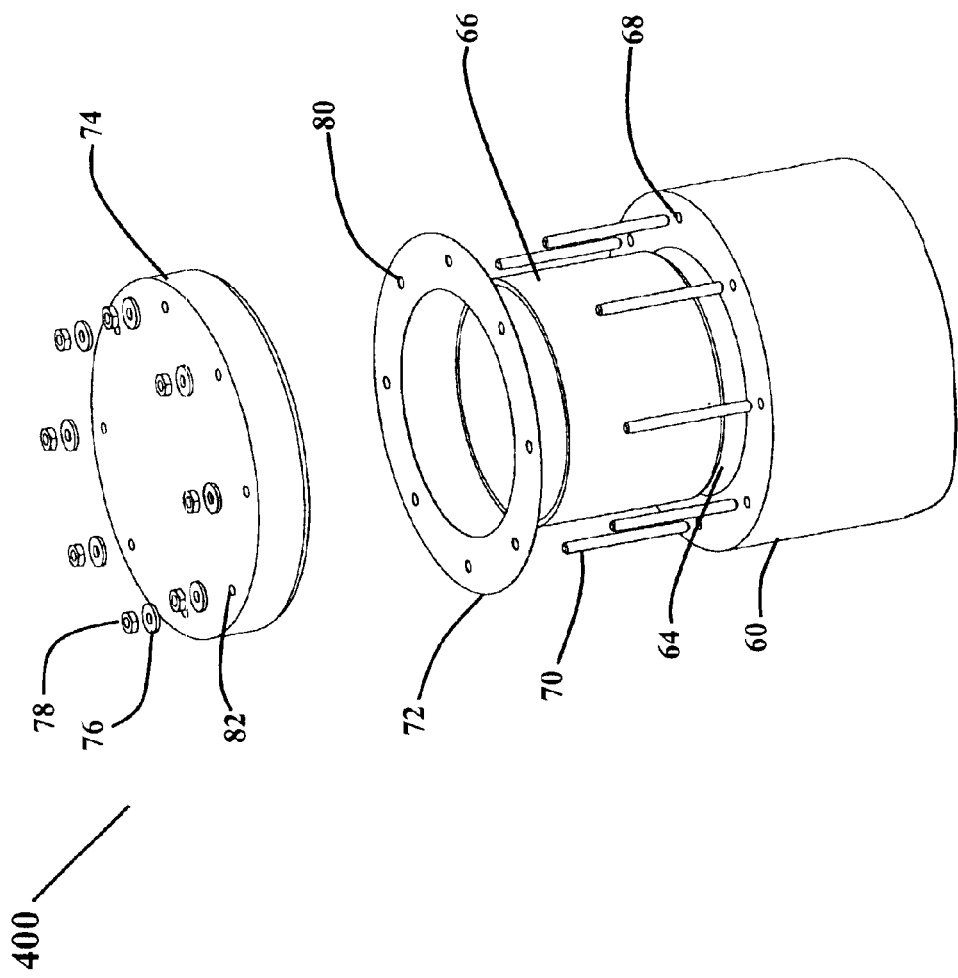
FIG. 8 shows a perspective of a first embodiment of a high-temperature annealing crucible of the present invention.

FIG. 8 shows a first embodiment of a high temperature annealing crucible generally designated as reference numeral 400. Crucible 400 includes a graphite crucible 60 with an inner region 64 designed to receive an inner crucible 66, such as an alumina or zirconia crucible, having a lid (not shown) of the same material, one or more threaded holes 68 designed to receive one or more studs 70, a sealing means 72, such as for example a graphite foil gasket, a graphite lid 74, and one or more washers 76 and one or more crucible nuts 78 that have a predetermined threading to couple to the exposed end of one or more studs 70.

The assembly of crucible 400 and annealing method constructed to principles of the present invention includes inserting within a clean environment such as glove box, an as-grown crystal, such as an AlSb, a first mixture (not shown) of, for example, Al—Sb having a majority of Sb atoms and a second mixture (not shown) of for example, Al—Sb having a majority of Al atoms, within inner crucible 66, having for example as one embodiment an $Al_2O_3$ content greater than 95% and as another embodiment an $Al_2O_3$ content greater than 99.8%. Next, crucible 66 is disposed within inner region 64 of graphite crucible 60 and the lid of inner crucible 66 is positioned to enclose inner crucible 66. Graphite crucible 60 and sealing means 72, having a thickness range of between about 0.020 and about 0.050 inches, are in one embodiment, commercially available materials (i.e., E+50/IM35) having a coefficient of thermal expansion of about $6.0 \times 10^{-6}$/° C. However, other materials, such as for example alumina, capable of meeting the requirements of the principles of the present invention, may also be employed. Sealing means 72 is located on an upper end of graphite crucible 60 by a designed hole pattern 80 that matches the number of one or more studs 70 threaded into the upper end of crucible 60. Graphite lid 74 next encloses sealing means 72, inner crucible 66, and graphite crucible 60 by being positioned and located through a second set of designed holes 82 by studs 70. Washers 76 and crucible nuts 78 are then threaded on an exposed upper end of studs 70 and crucible nuts 78 receive a substantial amount of torque such that crucible 400 is sealed to provide a constant volume. It is a benefit of the present invention that crucible nuts 78, are made from commercially available high-temperature materials. It is equally beneficial that studs 70, and washers 76, are made from commercially available (i.e., Richard Materials) high-temperature alloy TZM materials having a coefficient of thermal expansion of about $5.3 \times 10^{-6}/K°$. Such an expansion coefficient substantially matches in quantity and sign, the coefficients of inner crucible 66, sealing means 72, and graphite lid 74 so that upon being subjected to a heating step, a vacuum seal of the components of up to one atmosphere will remain intact.

FIG. 9(a) shows a unique steel chamber, generally designated as reference numeral 600, constructed to allow crucible 400, containing a crystal (not shown) and one or more two-phase materials (not shown), to be assembled and evacuated prior to an annealing step. Chamber 600 also includes a sealed torque extension bar 120, a vacuum port 124, and a steel chamber lid 126 capable of sealing an enclosed area 128 that is pulled to a vacuum of about 50 mil Torr by vacuum port 124.

FIG. 9(b) shows an enlarged section of chamber 600 and crucible 400 to best illustrate a rotation mechanism to allow access of extension bar 120 to crucible nuts 78. Thus, an integrally machined protrusion 130 of crucible 400 is removably attached to an integrally machined notch 131 of pedestal 132. Pedestal 132 and an external rotation handle 134, are rotatably attached and designed to keep a vacuum seal of bottom 136 of chamber 600. Moreover, rotation handle 134 allows pedestal 132 to rotate by 360 degrees such that each crucible nut(s) 78 shown in FIG. 9(a) can be received and torqued by extension bar 120 under vacuum to pressure seal crucible 400. This produces a vacuum tight crucible.

Turning exclusively again to FIG. 9(a), crucible 400, including the crystal and one or more pair of two phase mixtures, is then placed in a vacuum-annealing furnace (not shown) for an annealing temperature from about 700° C. to about 1050° C. for a time period of up to several days to several weeks depending on annealing temperature. After annealing, crucible nuts 78 are released to remove lid 74 and an annealed crystal (not shown) having a high resistivity of greater than about $10^7$ Ω-cm.

FIG. 10(a) shows a modified steel chamber, again generally designated as reference numeral 600, designed to allow assembly of an embodiment of crucible 400, containing an inner crucible (not shown), a crystal (not shown) and one or more two-phase materials (not shown), to be assembled and evacuated prior to an annealing step. Steel lid 226 of chamber 600, capable of a vacuum seal, includes a centrally located torque extension bar 220 and a vacuum port 224 that is capable of pulling an area 228 to a vacuum.

A pair of locator pins 230 removably attaches preferred crucible 400 to a pedestal 232 of steel chamber 600. Moreover, external rotation member 234 of chamber 600, capable of rotating pedestal 232 by 360 degrees, rotates a bottom 306 of crucible 400 as extension bar 220 applies a downward pressure to locking lid 300 that includes a pair of locking pins 302 removably attached to graphite lid 304. Locking lid 300 keeps graphite lid 304 stationary as bottom 306 is rotated by pedestal 232. A threading means (shown in FIG. 10(b)) causes lid 304 to press a sealing means 312, such as a graphite foil gasket, shown in FIG. 10(b), against an open end of bottom 306 to produce a vacuum seal of crucible 400.

FIG. 10(b) shows an enlarged view of the threading means of the preferred crucible 400 embodiment. As downward pressure is applied, locking lid 300 keeps graphite lid 304 stationary by locking pin(s) 302. The open end of bottom 306 having a 10 pitch thread on an outside diameter 310, is threaded to a 10 pitch thread of an inside diameter 308 of graphite lid 304. Accordingly, as bottom 306 is rotated by 360 degrees, an annular protrusion 309 having a radius of at least 0.25" presses sealing means 312 to an upper lip 314 of the open end of bottom 306 to create a vacuum pressure seal of crucible 400. Crucible 400 is then placed in a vacuum-annealing furnace (not shown) for annealing of a crystal (not shown) of the present invention. After annealing, crucible lid 304 and an annealed crystal having a high resistivity of greater than about $10^7$ Ω-cm are removed.

After obtaining an optimized single crystal (e.g., high resistivity,) constructed to principles of the present invention as discussed herein before, an AlSb semi-conductor high-energy detector can be fabricated in a variety of geometries known in the art. Generally, the common geometries are planar, coaxial, and hemispherical. The common semiconductor junction operationally (i.e., electrically connected) employed embodiments are for example, high resistivity (including intrinsic material) AlSb with ohmic contacts at both ends, p-n junctions with ohmic contacts at both ends, and Schottky barriers. However, metal-semiconductor-metal structures with metals such as, but not limited to Al, Au, and Ag as well as their alloys thereof, may also be operationally employed as is generally known in the art.

An exemplary n+-i-p+ embodiment of a high energy (e.g., gamma ray) detector generally constructed in accordance to principles of the present invention may be reversed biased. The n+ and p+ opposing faces may include thin ohmic contacts, i.e., less than the absorption length of the gamma or x-ray photons in the metal to allow for, for example, irradiation through the ohmic contacts. However, a perpendicular irradiation to directly irradiate the material may also be employed in conformance with the specifications of the present invention. An operational e-field, e.g., a pre-determined e-field as a result of a predetermined voltage based on a given detector width, allows for efficient charge collection of electron-hole pairs created after irradiation by electromagnetic radiation, such as high-energy rays, of the high resistivity AlSb crystal. Such a charge collection produces a signal in an operationally connected external circuitry that can indicate high-energy radiation, such as, Gamma-rays or X-rays.

It should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A material for detecting gamma rays or x-rays comprising: an energy band-gap greater than about 1.40 eV, an electron and a hole mobility greater than about 100 cm$^2$/Vs. a free carrier recombination time (τ) greater than about $10^{-6}$ s, a resistivity greater than about $10^7$ Ω-cm; and at least one of the elements has an atomic number (Z) greater than about 40.

2. The material of claim 1, wherein the material is a III-V compound.

3. The material of claim 1, wherein the material is capable of being adapted as an ambient gamma ray detector.

4. The material of claim 1, wherein the material is capable of being adapted as an ambient X-ray detector.

* * * * *